(12) United States Patent
Chen (10) Patent No.: US 11,917,747 B2
(45) Date of Patent: Feb. 27, 2024

(54) ELECTRONIC DEVICE AND CIRCUIT BOARD MODULE THEREOF

(71) Applicant: Chicony Electronics Co., Ltd., New Taipei (TW)

(72) Inventor: Chien-Yueh Chen, New Taipei (TW)

(73) Assignee: CHICONY ELECTRONICS CO., LTD., New Taipei (TW)

( * ) Notice: Subject to any disclaimer, the term of this patent is extended or adjusted under 35 U.S.C. 154(b) by 59 days.

(21) Appl. No.: 17/695,776

(22) Filed: Mar. 15, 2022

(65) Prior Publication Data
US 2023/0132928 A1 May 4, 2023

(30) Foreign Application Priority Data

Nov. 3, 2021 (TW) ................................ 110141044

(51) Int. Cl.
*H05K 1/14* (2006.01)
*H05K 1/02* (2006.01)
(Continued)

(52) U.S. Cl.
CPC .......... *H05K 1/0212* (2013.01); *H04N 23/52* (2023.01); *H04N 23/54* (2023.01); *H05K 1/0298* (2013.01);
(Continued)

(58) Field of Classification Search
CPC .... H05K 1/0212; H05K 1/0298; H05K 1/056; H05K 2201/10083; H05K 1/0203; H05K 1/0204; H05K 1/0206; H05K 1/0207; H05K 1/0209; H05K 1/181; H05K 1/182; H05K 7/20509; H05K 2201/09027; H05K 2201/10106; H05K 2201/1025; H05K 2201/10568; H05K 1/0274; H05K 2201/049; H05K 2201/10121; H05K 2201/10151; H05K 1/141; H05K 1/05;
(Continued)

(56) References Cited

U.S. PATENT DOCUMENTS

| 4,774,434 A | * | 9/1988 | Bennion | ................ H05K 1/189 313/511 |
| 7,972,036 B1 | * | 7/2011 | Schach | ................ F21V 29/773 362/345 |

(Continued)

FOREIGN PATENT DOCUMENTS

TW 201227905 A 7/2012

*Primary Examiner* — Steven T Sawyer
(74) *Attorney, Agent, or Firm* — MUNCY, GEISSLER, OLDS & LOWE, PC (57) ABSTRACT

A circuit board module includes a circuit board, a metal core printed circuit board, and a heating element. The circuit board includes a substrate, and a surface of the substrate has an assembling region. The metal core printed circuit board is on the assembling region and includes a first circuit layer and a second circuit layer. The first circuit layer and the second circuit layer are electrically connected to each other. The second circuit layer is electrically connected to the circuit board. The thermal conductivity of the metal core printed circuit board is greater than the thermal conductivity of the substrate. The heating element is on the metal core printed circuit board and is electrically connected to the first circuit layer. An electronic device having the circuit board module is also provided.

13 Claims, 5 Drawing Sheets

(51) Int. Cl.
*H05K 1/05* (2006.01)
*H04N 23/52* (2023.01)
*H04N 23/54* (2023.01)

(52) U.S. Cl.
CPC ............ *H05K 1/056* (2013.01); *H05K 1/141* (2013.01); *H05K 1/05* (2013.01); *H05K 2201/049* (2013.01); *H05K 2201/10083* (2013.01); *H05K 2201/10106* (2013.01)

(58) Field of Classification Search
CPC ........ H04N 23/52; H04N 23/54; H04N 23/51; H04N 23/56; H04N 23/698; H04N 23/55; F21K 9/20; F21K 9/90; F21V 15/01; F21V 23/004; F21V 23/006; F21V 23/02; F21V 23/06; F21V 29/50; F21V 29/70; H05B 45/10; H05B 47/18; H05B 45/00; H05B 45/12; H05B 45/18; H05B 45/325; H05B 45/37; F21Y 2115/10; G03B 17/55
See application file for complete search history.

(56) References Cited

U.S. PATENT DOCUMENTS

| | | | |
|---|---|---|---|
| 2003/0002260 A1* | 1/2003 | Hasebe | H01L 23/49833 |
| | | | 361/720 |
| 2006/0234420 A1* | 10/2006 | Yokozuka | H05K 1/021 |
| | | | 257/E23.105 |
| 2012/0154672 A1* | 6/2012 | Yamazaki | G06K 7/10732 |
| | | | 348/370 |
| 2013/0187571 A1* | 7/2013 | Yeh | H01L 25/167 |
| | | | 257/79 |
| 2014/0327024 A1* | 11/2014 | Ishihara | H01L 24/97 |
| | | | 438/27 |
| 2015/0003083 A1* | 1/2015 | Uehara | H05K 3/0058 |
| | | | 362/418 |
| 2016/0014878 A1* | 1/2016 | Kilhenny | H01L 23/142 |
| | | | 438/26 |
| 2016/0348884 A1* | 12/2016 | Reier | F21K 9/237 |
| 2016/0363308 A1* | 12/2016 | Shum | F21V 23/006 |
| 2017/0110640 A1* | 4/2017 | Kim | F21S 8/026 |
| 2017/0307962 A1* | 10/2017 | Lin | G02B 6/0051 |
| 2019/0116297 A1* | 4/2019 | Youmans | F21V 33/00 |
| 2020/0236252 A1* | 7/2020 | Song | H04N 23/56 |
| 2021/0135061 A1* | 5/2021 | Navabi | H01L 33/486 |
| 2021/0356844 A1* | 11/2021 | Song | G02B 3/0056 |
| 2022/0183161 A1* | 6/2022 | Lee | H05K 1/0203 |

* cited by examiner

ELECTRONIC DEVICE AND CIRCUIT BOARD MODULE THEREOF

CROSS-REFERENCE TO RELATED APPLICATION

This non-provisional application claims priority under 35 U.S.C. § 119(a) to Patent Application No. 110141044 filed in Taiwan, R.O.C. on Nov. 3, 2021, the entire contents of which are hereby incorporated by reference.

BACKGROUND

Technical Field

The instant disclosure relates to an electronic component, in particular, to a circuit board module and an electronic device with the circuit board module.

Related Art

Electronic components are provided on the circuit boards of various electronic devices. For example, regarding a camera device, a light source, e.g., light-emitting diode (LED), is usually applied to be served as the supplementary lighting. Therefore, when the camera device performs image capturing procedures, clearer images can be obtained owing to the illumination of the light source. Moreover, with the application of the light source, images can be captured with sufficient brightness at night or in low light conditions.

SUMMARY

However, during the operation, the temperature of electronic components with high power (such as the aforementioned light source) generally greatly increases. Moreover, the more the power of the electronic component is, the more the heat generated by the electronic component is. Therefore, under a long-term use, the high temperature of the electronic component not only easily affects the operation and service life of the electronic component but also affects the operations of other peripheral components. Especially, the high temperature of the electronic component may cause components which are not heat-resistant to be damaged, failed, or even spontaneously ignited.

In view of this, in one embodiment, a circuit board module is provided. The circuit board module comprises a circuit board, a metal core printed circuit board, and a heating element. The circuit board comprises a substrate, and a surface of the substrate has an assembling region. The metal core printed circuit board is disposed on the assembling region. The metal core printed circuit board comprises a first circuit layer and a second circuit layer. The first circuit layer and the second circuit layer are electrically connected to each other. The second circuit layer is electrically connected to the circuit board, and a thermal conductivity of the metal core printed circuit board is greater than a thermal conductivity of the substrate. The heating element is disposed on the metal core printed circuit board and electrically connected to the first circuit layer.

In another embodiment, an electronic device is provided. The electronic device comprises a housing and the aforementioned circuit board module, and the circuit board module is disposed in the housing.

Based on the above, in the circuit board module according to one or some embodiments of the instant disclosure, the heating element is disposed on the metal core printed circuit board. Therefore, the heat generated by the heating element upon the operation of the heating element can be quickly transmitted to the substrate of the circuit board through the metal core printed circuit board, so that the temperature of the heating element can be prevented from getting too high. Moreover, according to one or some embodiments of the instant disclosure, the metal core printed circuit board is just arranged on portions of the substrate. Therefore, in these embodiments, the cost for the circuit board module can be greatly reduced, as compared with embodiments having the metal core printed circuit board on the entire substrate. Furthermore, according one or some embodiments of the instant disclosure, the thermal conductivity of the substrate is less than the thermal conductivity of the metal core printed circuit board. Therefore, the heat generated by the heating element can be prevented from affecting operations of other components on the substrate.

BRIEF DESCRIPTION OF THE DRAWINGS

The disclosure will become more fully understood from the detailed description given herein below for illustration only, and thus not limitative of the disclosure, wherein.

DETAILED DESCRIPTION

Embodiments are provided for facilitating the descriptions of the instant disclosure. However, the embodiments are provided as examples for illustrative purpose, but not a limitation to the instant disclosure. In all the figures, the same reference numbers refer to identical or similar elements.

Figure 1:
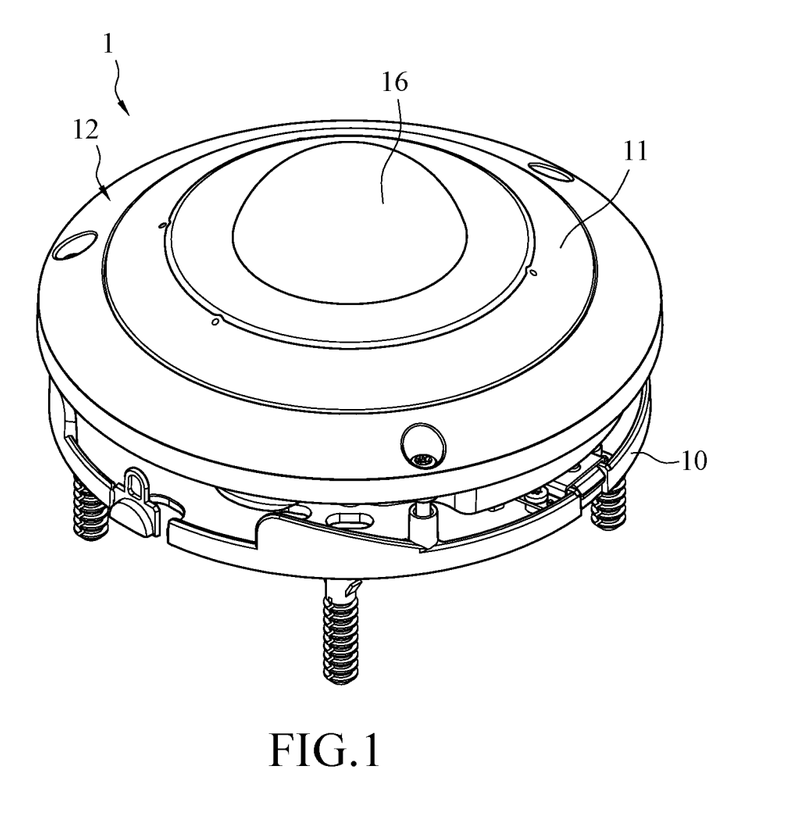
FIG. 1 illustrates a perspective view of an electronic device according to an exemplary embodiment of the instant disclosure.
Figure 2:
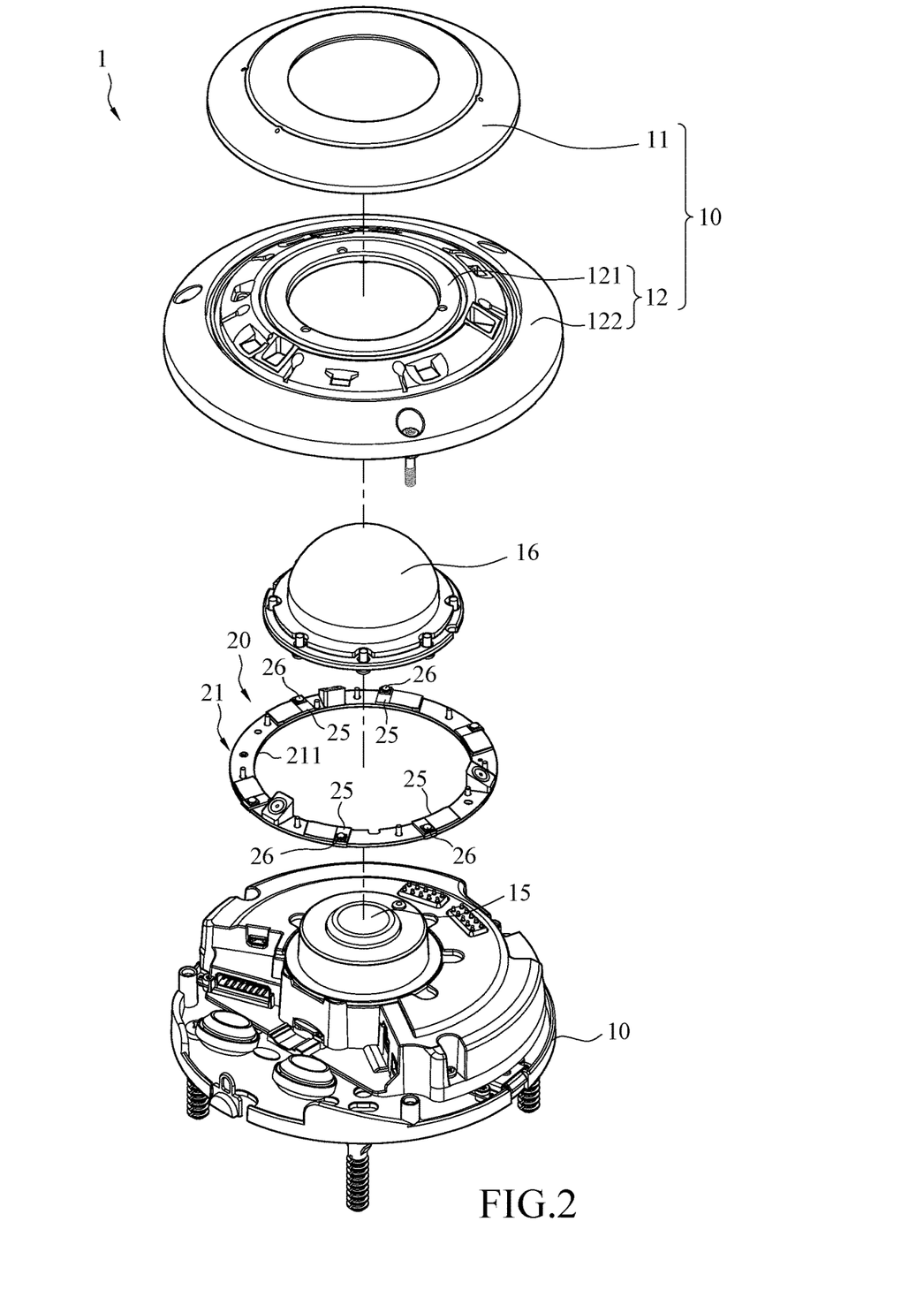
FIG. 2 illustrates an exploded view of the electronic device of the exemplary embodiment.

FIG. 1 illustrates a perspective view of an electronic device 1 according to an exemplary embodiment of the instant disclosure. FIG. 2 illustrates an exploded view of the electronic device 1 of the exemplary embodiment. As shown in FIG. 1 and FIG. 2, in this embodiment, the electronic device 1 comprises a housing 10 and a circuit board module 20, and the circuit board module 20 is disposed in the housing 10. For example, the circuit board module 20 may be fixed inside the housing 10 through locking, adhering or engaging. In some embodiments, the electronic device 1 may be a doorbell device (e.g., a wired doorbell, a wireless doorbell, or a smart doorbell). The electronic device 1 is adapted to be assembled at the entrance or exit of a residence, an office, or a commercial building, and the electronic device 1 can be served as a communication media between the indoor space and the outdoor space. Alternatively, in some embodiments, the electronic device 1 may be an IP camera, a network camera, a closed-circuit television (CCTV), or an analog surveillance camera, and the electronic device 1 is adapted to be assembled at different places (e.g., a kinder garden, an office, or a store), thus the electronic device 1 can perform the security surveillance function or record personnel activities. However, it is understood that the foregoing embodiments are provided for illustrative purposes, but not limitations of the instant disclosure; in some embodiments, the electronic device 1 may be an appliance assembled with the circuit board module 20.

Figure 3:
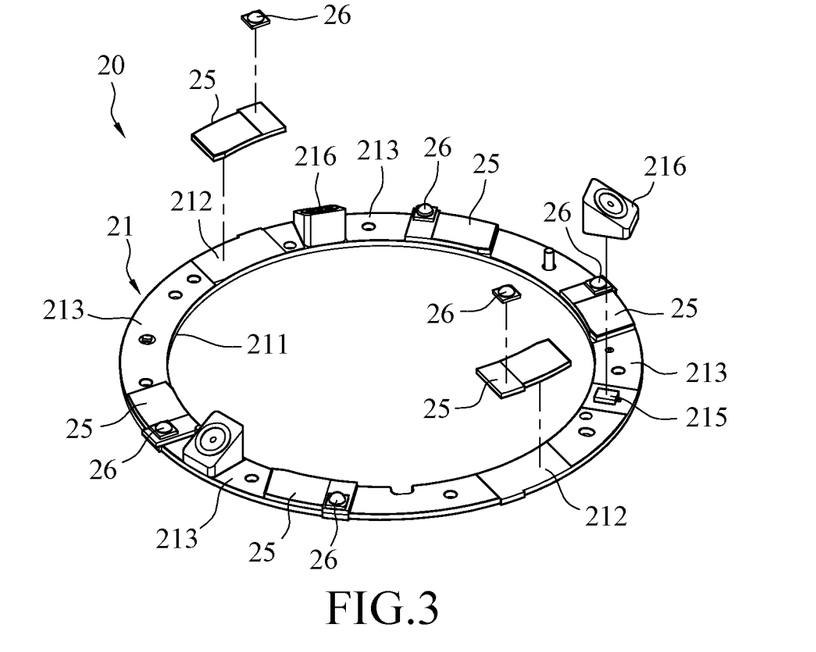
FIG. 3 illustrates an exploded view of a circuit board module according to an exemplary embodiment of the instant disclosure.

FIG. 3 illustrates an exploded view of a circuit board module 20 according to an exemplary embodiment of the instant disclosure. As shown in FIG. 2 and FIG. 3, the circuit board module 20 comprises a circuit board 21, at least one metal core printed circuit board 25, and at least one heating element 26. The circuit board 21 comprises a substrate 211, and a surface of the substrate 211 has an assembling region 212 and a circuit region 213. Specifically, in some embodiments, the assembling region 212 and the circuit region 213 are different portions of the surface of the substrate 211. The assembling region 212 is for assembling with the metal core printed circuit board 25 and the heating element 26, and the circuit region 213 is for assembling with other electronic components (e.g., a conductive wire, a microprocessor, a microphone, a resistor, and a capacitor).

In some embodiments, the shape of the circuit board 21 may be configured according to actual requirements. For example, as shown in FIG. 2 and FIG. 3, in this embodiment, an image capturing module 15 is disposed in the housing 10 of the electronic device 1. For example, the image capturing module 15 may be a charge-coupled device (CCD), a complementary metal-oxide semiconductor (CMOS), a CMOS active pixel sensor, or the like. The substrate 211 of the circuit board 21 of the circuit board module 20 may be an annular-shaped board (for example, in this embodiment, the substrate 211 is of a circular ring shape, but may also be rectangular ring shaped, elliptical ring shaped, or other irregular ring shaped), and the substrate 211 formed in an annular shape surrounds the image capturing module 15. However, embodiments are not limited thereto, and the substrate 211 may be configured as other non-annular structures. In some embodiments, the circuit board 21 may comprise several substrates 211, and the substrates 211 are spaced apart from each other and arranged around the periphery of the image capturing module 15. Moreover, the substrates 211 may be individually arranged or electrically connected to each other.

Moreover, as shown in FIG. 2, in this embodiment, the electronic device 1 may further comprise a light-permissible shield 16 to cover the image capturing module 15, so that the image capturing module 15 can be protected by the light-permissible shield 16. For example, the light-permissible shield 16 may be made of a transparent material, and the transparent material for example may be polycarbonate (PC), polymethyl methacrylate (PMMA), or glass materials. Therefore, an external light can pass through the light-permissible shield 16 to be transmitted to the image capturing module 15, so that the image capturing module 15 can perform image sensing to obtain images properly.

Figure 5:
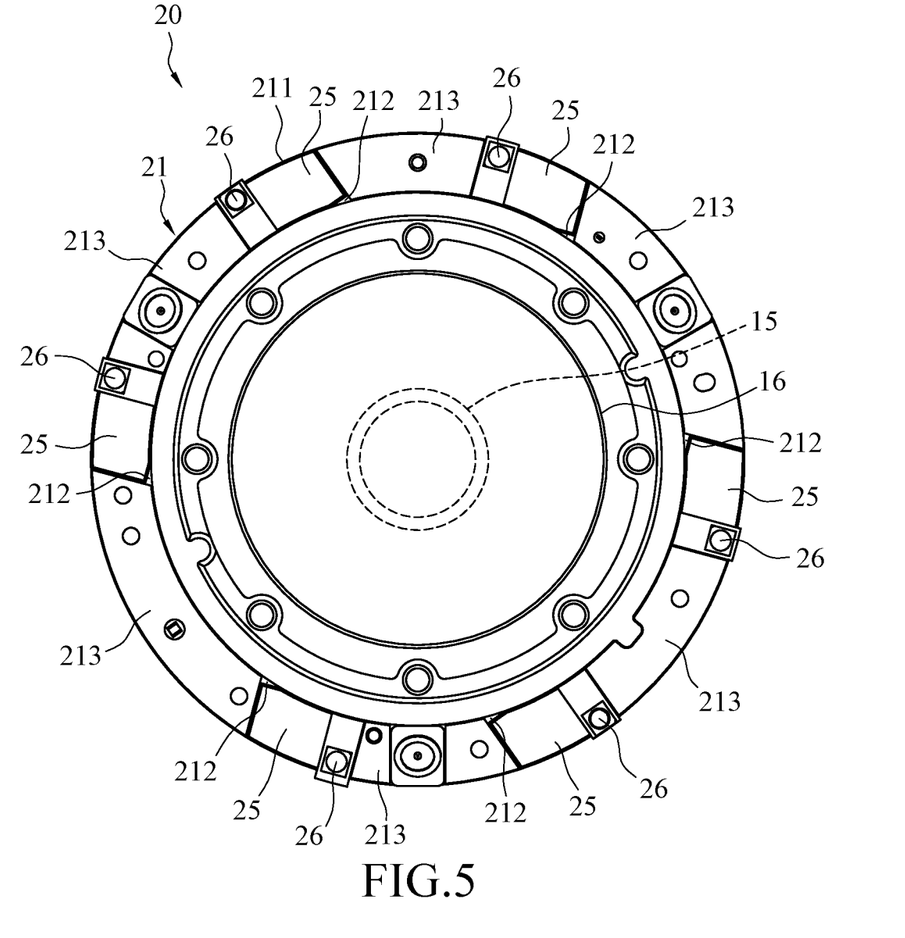
FIG. 5 illustrates a plan view of the circuit board module of the exemplary embodiment.

In some embodiments, the number of the assembling region 212, the circuit region 213, the metal core printed circuit board 25, and the heating element 26 can be adjusted according to actual requirements. For example, as shown in FIG. 5, FIG. 5 illustrates a plan view of the circuit board module 20 of the exemplary embodiment. In this embodiment, the number of the assembling region 212, the metal core printed circuit board 25, and the heating element 26 are plural (in this embodiment, the number is six, but embodiments are not limited thereto). The assembling regions 212 are at different locations of the surface of the substrate 211 and are annularly arranged around the periphery of the image capturing module 15, and the metal core printed circuit boards 25 and the heating elements 26 are assembled on the assembling regions 212 respectively. Moreover, in this embodiment, the number of the circuit region 213 is also plural, and each of the circuit regions 213 is between the assembling regions 212. However, it is understood that the foregoing embodiments are provided for illustrative purposes, but not limitations of the instant disclosure. In some embodiments, the number of the assembling region 212, the circuit region 213, the metal core printed circuit board 25, and the heating element 26 may be one, depending on the actual product requirements.

Figure 4:
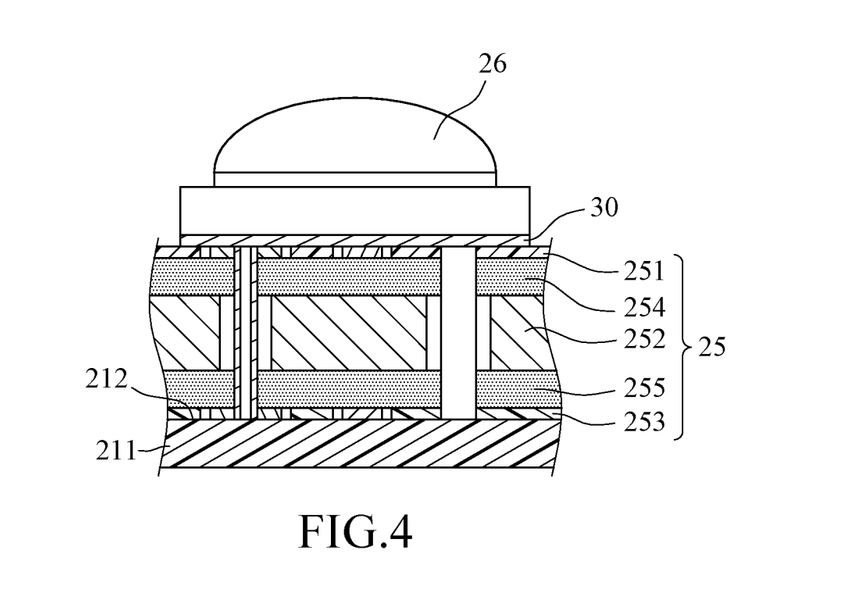
FIG. 4 illustrates a cross-sectional view of the circuit board module of the exemplary embodiment.

FIG. 4 illustrates a cross-sectional view of the circuit board module 20 of the exemplary embodiment. As shown in FIG. 3 and FIG. 4, taking one assembly of the metal core printed circuit board 25 and the heating element 26 as an example, the metal core printed circuit board 25 is stacked on the assembling region 212 of the substrate 211, and the metal core printed circuit board 25 comprises a first circuit layer 251, a first spacing layer 254, a metal thermal conductive layer 252, a second spacing layer 255, and a second circuit layer 253. The first circuit layer 251, the first spacing layer 254, the metal thermal conductive layer 252, the second spacing layer 255, and the second circuit layer 253 are stacked one another. The metal thermal conductive layer 252 is between the first circuit layer 251 and the second circuit layer 253, the first spacing layer 254 is sandwiched between the first circuit layer 251 and the metal thermal conductive layer 252, and the second spacing layer 255 is sandwiched between the metal thermal conductive layer 252 and the second circuit layer 253. In this embodiment, the first circuit layer 251 is the top layer of the metal core printed circuit board 25, the second circuit layer 253 is the bottom layer of the metal core printed circuit board 25, and the second circuit layer 253 is nearer to the substrate 211 of the circuit board 21 as compared to the first circuit layer 251. In other words, in this embodiment, the distance between the second circuit layer 253 of the metal core printed circuit board 25 and the substrate 211 of the circuit board 21 is less than the distance between the first circuit layer 251 of the metal core printed circuit board 25 and the substrate 211 of the circuit board 21.

As shown in FIG. 3 and FIG. 4, the heating element 26 is disposed on the metal core printed circuit board 25 and electrically connected to the first circuit layer 251, the first circuit layer 251 and the second circuit layer 253 of the metal core printed circuit board 25 are electrically connected to each other, and the second circuit layer 253 is electrically connected to the circuit board 21. Therefore, the heating element 26 is electrically connected to the circuit board 21 indirectly through the first circuit layer 251 and the second circuit layer 253.

In some embodiments, the heating element 26 may be a light emitting element; for example, the light emitting element may be a light-emitting diode (LED), an infrared light, an incandescent light, or a halogen light. The light emitting direction or the light emitting angle of the light emitted by the heating element 26 can be adjusted to meet different product requirements. For example, the light emitted by the heating element 26 can be adjusted through changing the orientation of the heating element 26. Alternatively, in some embodiments, a light guiding structure may be provided in the heating element 26, so that the light emitting direction or the light emitting angle of the light emitted by the heating element 26 can be adjusted through the light guiding structure. Alternatively, in some embodiments, the metal core printed circuit board 25 may be arranged in a sloping manner on the assembling region 212 of the substrate 211. Hence, through the inclination angle or the inclination direction of the metal core printed circuit board 25, the light emitting direction or the light emitting angle of the light emitted by the heating element 26 can be adjusted.

In some embodiments, the first circuit layer 251 and the second circuit layer 253 of the metal core printed circuit board 25 may be copper circuit layers or silver paste circuit layers and are electrically conductive, where the first circuit layer 251 and the second circuit layer 253 may be formed by etching, printing, or the like. In other words, in this embodiment, the first circuit layer 251 and the second circuit layer 253 may respectively comprise circuits formed by etching, printing, or the like. The metal thermal conductive layer 252 of the metal core printed circuit board 25 may be a metal plate (e.g., a copper plate or an aluminum plate) to perform great thermal conduction and thermal dissipation functions. For example, the thermal conductivity of the metal thermal conductive layer 252 is 200 W/mK or more. The first spacing layer 254 and the second spacing layer 255 allow the first circuit layer 251 and the second circuit layer 253 to be spaced from the metal thermal conductive layer 252, respectively. Therefore, the first circuit layer 251, the second circuit layer 253, and the metal thermal conductive layer 252 can be prevented from contacting each other, and the short-circuited condition of the heating element 26 can be avoided.

In some embodiments, the first spacing layer 254 and the second spacing layer 255 may be made of an inorganic insulation material (e.g., ceramic or asbestos), an organic insulation material (e.g., resin, rubber, silk, cotton, or paper), or a composite material obtained by processing the inorganic insulation material and the organic insulation material. Alternatively, in some embodiments, the first spacing layer 254 and the second spacing layer 255 may be thermal conductive insulation layers. For example, the first spacing layer 254 and the second spacing layer 255 may be thermal conductive adhesive layers to provide adhering, insulation, and great thermal conduction functions at the same time. For example, the thermal conductivities of the first spacing layer 254 and the second spacing layer 255 may be 1 W/mK or more. However, it is understood that the foregoing embodiments are provided for illustrative purposes, but not limitations of the instant disclosure. In some embodiments, the first spacing layer 254 and the second spacing layer 255 may be thermal conductive insulation pads (e.g., thermal conductive silicone pads or thermal conductive carbon fiber pads).

Furthermore, as shown in FIG. 3 and FIG. 4, the thermal conductivity of the metal core printed circuit board 25 is further greater than the thermal conductivity of the substrate 211. For example, the overall thermal conductivity of the metal core printed circuit board 25 may be 3 W/mK or more, and the substrate 211 of the circuit board 21 may be a resin substrate (e.g., an FR-4 epoxy resin substrate). Hence, the thermal conductivity of the substrate 211 is 0.4 W/mK or less, which is much less than the thermal conductivity of the metal core printed circuit board 25. Therefore, the thermal conductivity of the metal core printed circuit board 25 is much greater than the thermal conductivity of the substrate 211.

Based on the above, according to one or some embodiments of the instant disclosure, the heating element 26 is disposed on the metal core printed circuit board 25 rather than directly on the substrate 211. Hence, because of the high thermal conductivity of the metal core printed circuit board 25, the heat generated by the heating element 26 during the operation of the heating element 26 can be transmitted and dissipated quickly. Therefore, the temperature of the heating element 26 can be prevented from getting too high to affect the operation efficiency and the service life of the heating element 26. Moreover, the thermal conductivity of the substrate 211 of the circuit board 21 is less than the thermal conductivity of the metal core printed circuit board 25; namely, in this embodiment, the thermal resistance of the substrate 211 is much greater than the thermal resistance of the metal core printed circuit board 25. Therefore, though the metal core printed circuit board 25 is disposed on the substrate 211, and the heat generated by the heating element 26 during the operation of the heating element 26 can be transmitted to the substrate 211 through the metal core printed circuit board 25; however, owing that the thermal conductivity of the substrate 211 is less than the thermal conductivity of the metal core printed circuit board 25, the heat generated by the heating element 26 does not cause the overall temperature of the substrate 211 to become too high, thereby preventing the heat generated by the heating element 26 from affecting operations of other components on the substrate 211.

For example, as shown in FIG. 2 and FIG. 3, in this embodiment, the electronic component 215 disposed on the circuit region 213 of the substrate 211 may be a component with poorer heat resistance (e.g., a microphone component which allows the electronic device 1 to receive external voices). In other words, in this embodiment, the maximum allowable temperature of the electronic component 215 during normal operation is less than the maximum allowable temperature of the heating element 26. Therefore, according to one or some embodiments of the instant disclosure, the heating element 26 that generates high-temperature heat during operation is disposed on the metal core printed circuit board 25, and the electronic component 215 with poorer thermal resistance is disposed on the circuit region 213 of the substrate 211. Hence, the heat generated by the heating element 26 can be transmitted and dissipated quickly through the metal core printed circuit board 25, and the heat generated by the heating element 26 does not cause the temperature of the substrate 211 to become too high. Consequently, the temperature of the electronic component 215 disposed on the substrate 211 can be prevented from exceeding the maximum allowable temperature of the electronic component 215 to cause the electronic component 215 on the substrate 211 to be damaged, failed or even spontaneously ignited.

As shown in FIG. 3, a protection shield 216 may be provided for covering the electronic component 215 on the circuit region 213 of the substrate 211. For example, the protection shield 216 may be a rubber shield or a plastic shield, so that the electronic component 215 can be further protected by the protection shield 216.

Further, as shown in FIG. 4, the heating element 26 and the first circuit layer 251 of the metal core printed circuit board 25 may be electrically connected to each other through an electrical conductive adhesive layer 30. For example, the heating element 26 may be soldered and fixed on the first circuit layer 251 through surface-mount technology (SMT), and the heating element 26 is electrically connected to the first circuit layer 251. Specifically, in this embodiment, the electrical conductive adhesive layer 30 may be a tin paste layer and arranged between the heating element 26 and the first circuit layer 251. Then, the electrical conductive adhesive layer 30 is processed by a high-temperature melting procedure as well as a cooling and solidification procedure in order, so that the heating element 26 can be soldered and fixed on the first circuit layer 251. Accordingly, the heating element 26 and the first circuit layer 251 are electrically connected to each other through the electrical conductive adhesive layer 30. As compared with other fixing manners (such as locking or spot welding), through the electrical conductive adhesive layer 30, the entire bottom surface of the heating element 26 can be ensured to contact the metal core printed circuit board 25, thereby not only increasing the thermal conduction area of the heating element 26 to thus enhance the heat dissipation efficiency, but also preventing the heating element 26 from having getting wrapped or deflected after the heating element 26 is soldered and fixed on the first circuit layer 251. Moreover, through the surface-mount technology, the heating element 26 can be attached to the first circuit layer 251 quickly to reduce labor and time costs.

Figure 6:
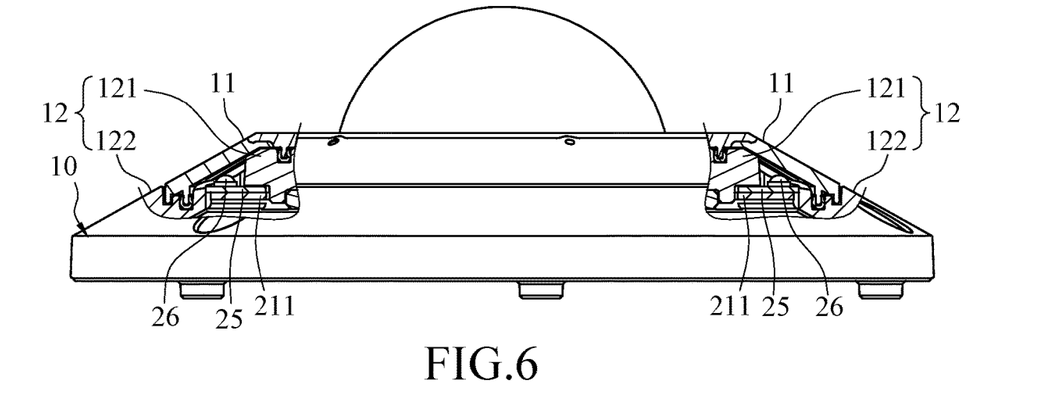
FIG. 6 illustrates a plan view of the electronic device of the exemplary embodiment.
Figure 7:
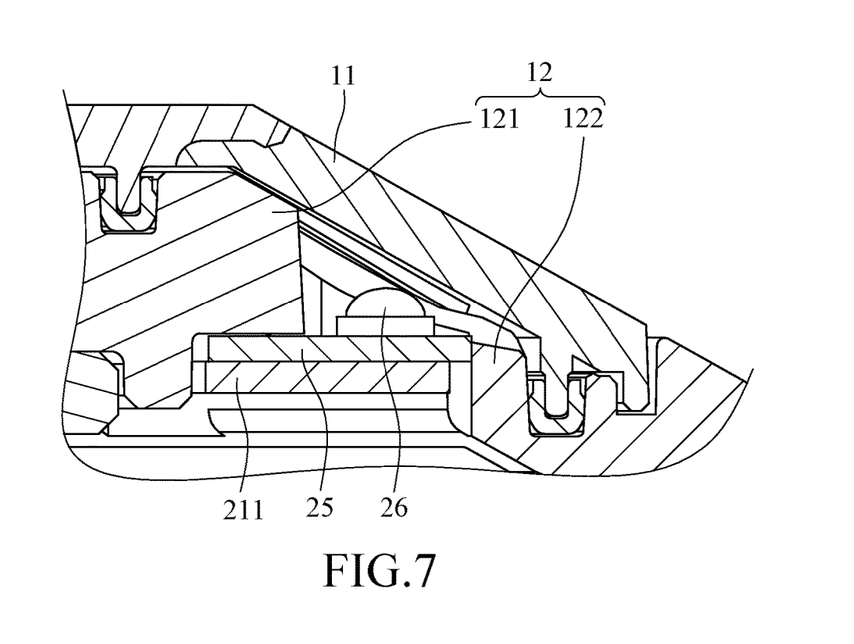
FIG. 7 illustrates an enlarged partial cross-sectional view of the electronic device shown in FIG. 6.

FIG. 6 illustrates a plan view of the electronic device 1 of the exemplary embodiment. FIG. 7 illustrates an enlarged partial cross-sectional view of the electronic device 1 of the exemplary embodiment. As shown in FIG. 2, FIG. 6, and FIG. 7, in this embodiment, the housing 10 of the electronic device 1 comprises a light-permissible portion 11, the circuit board module 20 is disposed in the housing 10, and the heating element 26 is a light emitting element and corresponds to the light-permissible portion 11. Therefore, the light emitted by the heating element 26 can pass through the light-permissible portion 11 of the housing 10 to provide a supplementary lighting. For example, the light-permissible portion 11 may be a through hole or a transparent plate. For example, the transparent plate may be made of a transparent material, and the transparent material, for example, may be polycarbonate (PC), polymethyl methacrylate (PMMA), or glass materials, so that a visible light can pass through the light-permissible portion 11. Alternatively, in some embodiments, the light-permissible portion 11 may be filter plate, so that the light within certain wavelength ranges (e.g., the infrared with a certain wavelength range between 650 nm and 1000 nm) can pass through the light-permissible portion 11.

In some embodiments, the shape of the light-permissible portion 11 corresponds to the shape of the circuit board 21. For example, as shown in FIG. 2, in this embodiment, the light-permissible portion 11 is annular-shaped to correspond to the annular-shaped circuit board 21. Alternatively, in some embodiments, the light-permissible portion 11 may be several light-permissible regions to correspond to the heating elements 26, respectively.

Further, as shown in FIG. 2, FIG. 6, and FIG. 7, the housing 10 of the electronic device 1 further comprises at least one thermal conductive cover 12, and each of the metal core printed circuit boards 25 of the circuit board module 20 further contacts the thermal conductive cover 12. Therefore, the heat of the metal core printed circuit boards 25 can be transmitted to the thermal conductive cover 12 to enhance the heat dissipation performance of the circuit board module 20. In some embodiments, the material of the thermal conductive cover 12 may be copper, aluminum, iron, or other metal alloys (e.g., aluminum alloy) to have high thermal conductivity (e.g., the thermal conductivity of the thermal conductive cover 12 is 200 W/mK or more). Hence, heat conduction and dissipation performance of the circuit board module 20 can be further enhanced.

As shown in FIG. 6 and FIG. 7, in this embodiment, the thermal conductive cover 12 comprises an inner metal cover 121 and an outer metal cover 122, and the materials of the inner metal cover 121 and the outer metal cover 122 may be copper, aluminum, iron, or other metal alloys, respectively. The light-permissible portion 11 is connected between the inner metal cover 121 and the outer metal cover 122. Moreover, one of two sides of the metal core printed circuit board 25 contacts the inner metal cover 121, and the other side of the metal core printed circuit board 25 contacts the outer metal cover 122. For example, in this embodiment, a portion of the surface of one of two sides of the metal core printed circuit board 25 contacts the inner metal cover 121 to increase the thermal conduction area, and a side edge of the other side of the metal core printed circuit board 25 protrudes from the substrate 211 and contacts the outer metal cover 122. Accordingly, the heat of the metal core printed circuit boards 25 can be transmitted to the metal covers (the inner metal cover 121 and the outer metal cover 122) at the same time to further enhance the heat dissipation performance. In some embodiments, the metal core printed circuit board 25 may only contact the inner metal cover 121 or the outer metal cover 122, but embodiments are not limited thereto.

Based on the above, in the circuit board module according to one or some embodiments of the instant disclosure, the heating element is disposed on the metal core printed circuit board. Therefore, the heat generated by the heating element upon the operation of the heating element can be quickly transmitted to the substrate of the circuit board through the metal core printed circuit board, so that the temperature of the heating element can be prevented from getting too high. Moreover, according to one or some embodiments of the instant disclosure, the metal core printed circuit board is just disposed on portions of the substrate. Therefore, in these embodiments, the cost for the circuit board module can be greatly reduced, as compared with embodiments having the metal core printed circuit board on the entire substrate. Furthermore, according one or some embodiments of the instant disclosure, the thermal conductivity of the substrate is less than the thermal conductivity of the metal core printed circuit board. Therefore, the heat generated by the heating element can be prevented from affecting operations of other components on the substrate.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A circuit board module comprising:
   a circuit board comprising a substrate, wherein a surface of the substrate has an assembling region;
   a metal core printed circuit board disposed on the assembling region and comprising a first circuit layer and a second circuit layer, wherein the first circuit layer and the second circuit layer are electrically connected to each other, the second circuit layer is electrically connected to the circuit board, and a thermal conductivity of the metal core printed circuit board is greater than a thermal conductivity of the substrate; and
   a heating element disposed on the metal core printed circuit board and electrically connected to the first circuit layer;
   wherein the number of the assembling region of the substrate, the number of the metal core printed circuit board, and the number of the heating element are plural; the assembling regions are arranged around on a periphery of an image capturing module, the metal core printed circuit boards are arranged on the assembling regions respectively, and the heating elements are disposed on the metal core printed circuit boards respectively.

2. The circuit board module according to claim 1, wherein the metal core printed circuit board further comprises a first spacing layer, a metal thermal conduction layer, and a second spacing layer; the metal thermal conduction layer is between the first spacing layer and the second spacing layer, the first spacing layer is sandwiched between the first circuit layer and the metal thermal conduction layer, and the second spacing layer is sandwiched between the metal thermal conduction layer and the second circuit layer.

3. The circuit board module according to claim 2, wherein the first spacing layer and the second spacing layer each are a thermal conductive insulation layer.

4. The circuit board module according to claim 1, wherein the substrate is a resin substrate.

5. The circuit board module according to claim 1, wherein the circuit board comprises an electronic component; the surface of the substrate has a circuit region, the circuit region and the assembling region are arranged at different portions of the surface of the substrate, and the electronic component is disposed on the circuit region.

6. The circuit board module according to claim 5, wherein a maximum allowable temperature of the electronic component is less than a maximum allowable temperature of the heating element.

7. The circuit board module according to claim 5, wherein the electronic component is a microphone component.

8. The circuit board module according to claim 1, wherein the heating element and the first circuit layer are electrically connected to each other through an electrical conductive adhesive layer.

9. An electronic device comprising:
a housing; and
the circuit board module according to claim 1, wherein the circuit board module is disposed in the housing.

10. The electronic device according to claim 9, wherein the housing comprises a light-permissible portion, and the heating element of the circuit board module is a light emitting element and corresponds to the light-permissible portion.

11. The electronic device according to claim 9, wherein the substrate of the circuit board of the circuit board module surrounds the image capturing module.

12. The electronic device according to claim 9, wherein the housing comprises at least one thermal conductive cover, and the metal core printed circuit board of the circuit board module contacts the at least one thermal conductive cover.

13. The electronic device according to claim 12, wherein the at least one thermal conductive cover comprises an inner metal cover and an outer metal cover, one of two sides of the metal core printed circuit board contacts the inner metal cover, and the other side of the metal core printed circuit board contacts the outer metal cover.

* * * * *